(12) United States Patent
Watanabe et al.

(10) Patent No.: US 11,085,703 B2
(45) Date of Patent: Aug. 10, 2021

(54) HEATSINK

(71) Applicant: FURUKAWA ELECTRIC CO., LTD., Tokyo (JP)

(72) Inventors: Yosuke Watanabe, Tokyo (JP); Kenya Kawabata, Tokyo (JP); Yoshikatsu Inagaki, Tokyo (JP); Tatsuro Miura, Tokyo (JP); Kazuaki Aotani, Tokyo (JP); Toshiaki Nakamura, Tokyo (JP)

(73) Assignee: FURUKAWA ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 17/010,574

(22) Filed: Sep. 2, 2020

(65) Prior Publication Data
US 2020/0400379 A1    Dec. 24, 2020

Related U.S. Application Data

(63) Continuation of application No. PCT/JP2020/015594, filed on Apr. 7, 2020.

(30) Foreign Application Priority Data

Apr. 18, 2019   (JP) .............................. JP2019-079601

(51) Int. Cl.
*F28D 15/02*   (2006.01)
*F28D 15/04*   (2006.01)
(Continued)

(52) U.S. Cl.
CPC ..... *F28D 15/0233* (2013.01); *F28D 15/0275* (2013.01); *F28D 15/046* (2013.01);
(Continued)

(58) Field of Classification Search
CPC ............. F28D 15/0233; F28D 15/0275; F28D 15/046; F28D 2021/0029; F28D 15/04;
(Continued)

(56) References Cited

U.S. PATENT DOCUMENTS 3,563,309 A * 2/1971 Basiulis .................. F28D 15/06
                                                         165/104.26
3,754,594 A * 8/1973 Ferrell .................. F28D 15/046
                                                         165/272
(Continued)

FOREIGN PATENT DOCUMENTS

EP       3232752 A1    10/2017
EP       3686540 A1     7/2020
(Continued)

OTHER PUBLICATIONS

English translation of the Written Opinion of the International Searching Authority (Forms PCT/IB/345, PCT/IB/310 and PCT/ISA/237) for International Application No. PCT/JP2020/015594, dated Jul. 7, 2020.
(Continued)

*Primary Examiner* — Tho V Duong
(74) *Attorney, Agent, or Firm* — Birch, Stewart, Kolasch & Birch, LLP

(57) ABSTRACT

The present disclosure is to provide a heatsink that can improve heat radiation performance of a heat radiating fin while preventing dry-out of a heat receiving portion and that can equalize a heat input in the heat receiving portion in an environment in which an installation space of the heatsink is limited even when a forbidden region exists in the installation space.

A heatsink including: a heat transport member having a heat receiving portion thermally connected to a heating element; and a heat radiating fin group which is connected to a heat radiating portion of the heat transport member and in which a plurality of heat radiating fins is arranged, wherein the heat transport member has an integral internal space that communicates from the heat receiving portion to the heat radiating portion and that is filled with a working fluid, a wick structure extended from the heat receiving portion to the
(Continued)

heat radiating portion is housed in the internal space of the heat transport member, and the heat transport member has a heat radiating-side step portion, in which a step is provided in a direction that is not a direction parallel to a heat transport direction of the heat transport member, between a heat insulating portion placed between the heat receiving portion and the heat radiating portion and the heat radiating portion, the heat radiating portion being placed on a side of an installation surface of the heatsink compared to the heat insulating portion.

10 Claims, 8 Drawing Sheets

(51) Int. Cl.
  *F28F 1/28* (2006.01)
  *F28F 3/02* (2006.01)
  *F28D 21/00* (2006.01)
(52) U.S. Cl.
  CPC ............... *F28F 1/28* (2013.01); *F28F 3/025* (2013.01); *F28D 2021/0029* (2013.01); *F28F 2215/00* (2013.01)
(58) Field of Classification Search
  CPC .......... F28F 1/28; F28F 3/025; F28F 2215/00; F28F 9/22; H05K 7/20336
  See application file for complete search history.

(56) References Cited

U.S. PATENT DOCUMENTS

| | | | | |
|---|---|---|---|---|
| 4,523,636 A * | 6/1985 | Meijer | ................ | F28D 15/0233 122/366 |
| 5,253,702 A * | 10/1993 | Davidson | ............ | F28D 15/0233 165/80.4 |
| 6,410,982 B1 * | 6/2002 | Brownell | ............ | F28D 15/0266 257/713 |
| 6,914,780 B1 * | 7/2005 | Shanker | .............. | F28D 15/0233 165/104.33 |
| 7,552,759 B2 | 6/2009 | Liu et al. | | |
| 8,246,902 B2 * | 8/2012 | Hou | ........................ | F28F 3/022 419/6 |
| 2007/0240858 A1 | 10/2007 | Hou et al. | | |
| 2007/0272399 A1 | 11/2007 | Nitta et al. | | |
| 2011/0232877 A1 * | 9/2011 | Meyer, IV | .......... | F28D 15/0266 165/104.26 |
| 2014/0165638 A1 | 6/2014 | Yoshikawa et al. | | |
| 2015/0043168 A1 | 2/2015 | Douglas et al. | | |
| 2017/0356694 A1 | 12/2017 | Tan et al. | | |
| 2018/0306523 A1 | 10/2018 | Sasaki | | |
| 2019/0339023 A1 | 11/2019 | Huang et al. | | |
| 2020/0041215 A1 | 2/2020 | Inagaki et al. | | |

FOREIGN PATENT DOCUMENTS

| | | |
|---|---|---|
| EP | 3688539 A1 | 7/2020 |
| EP | 3758057 A1 | 12/2020 |
| JP | 55-102889 A | 8/1980 |
| JP | 2003-1100072 A | 4/2003 |
| JP | 2011-47593 A | 3/2011 |
| JP | 6485075 B2 | 3/2019 |
| TW | M412344 U1 | 9/2011 |
| WO | WO 2013/018667 A1 | 2/2013 |
| WO | 2017/115771 A1 | 7/2017 |
| WO | WO 2018/190375 A1 | 10/2018 |

OTHER PUBLICATIONS

English translation of Decision of Refusal dated Sep. 20, 2019 in corresponding Japanese Patent Application No. 2019-079601.
International Search Report and Written Opinion of the International Searching Authority (Forms PCT/ISA/210 and PCT/ISA/237) for International Application No. PCT/JP2020/015594, dated Jul. 7, 2020.
Japanese Office Action for corresponding Japanese Application No. 2019-079601, dated Jul. 10, 2019, with English translation.
Taiwanese Office Action and Search Report for corresponding Taiwanese Application No. 109112974, dated Jul. 2, 2020, with English translation of the Office Action.
Extended European Search Report, dated May 12, 2021, for corresponding European Application No. 2077515.3.

* cited by examiner

HEATSINK

CROSS REFERENCE TO RELATED APPLICATIONS

The present application is a continuation application of International Patent Application No. PCT/JP2020/15594 filed on Apr. 7, 2020, which claims the benefit of Japanese Patent Application No. 2019-79601, filed on Apr. 18, 2019. The contents of these applications are incorporated herein by reference in their entirety.

BACKGROUND

Technical Field

The present disclosure relates to a heatsink that cools a heating element such as an electric/electronic component mounted on a substrate such as an electronic circuit board, and more specifically relates to a heatsink that can cool a heating element even when there is a forbidden region in a narrow space on the substrate.

BACKGROUND

As a function of an electronic device is improved, many components including a heating element such as an electronic component are mounted at high density on a substrate such as an electronic circuit board inside the electronic device. Also, with improvement in an electronic device, an amount of heat generated by a heating element such as an electronic component is increased. There is a case where a heatsink is used as a means to cool a heating element such as an electronic component. As a heatsink, a heat pipe-type heatsink including a tubular heat pipe is generally used.

As a heat pipe-type heatsink, for example, there is a heat pipe-type heatsink in which many flat plate-like heat radiating fins are provided in a manner of being protruded to an outer peripheral surface of a plurality of tubular heat pipes (Japanese Patent Application Laid-Open No. 2003-110072). The heatsink in Japanese Patent Application Laid-Open No. 2003-110072 is a heatsink configured to transport heat of a heating element to a heat radiating fin by a plurality of tubular heat pipes and to radiate the heat from the heat radiating fin.

On the other hand, recently, many components including a heating element such as an electronic component are mounted at increasingly higher density inside an electronic device. Thus, there is a case where an installation space for a heatsink on a substrate is limited to a narrow space. Also, since an amount of heat generated by an electronic component is increased due to improvement in a function of the electronic component and the like, space saving and further improvement in cooling performance are required for a heatsink.

In a heatsink such as the heatsink in Japanese Patent Application Laid-Open No. 2003-110072 which heatsink transports heat of a heating element to a heat radiating fin by a plurality of heat pipes, it is necessary to form a heat pipe group in which many heat pipes are arranged in parallel and to thermally connect the heat pipe group to the heating element in order to improve cooling performance. However, when a heat pipe group including many heat pipes is thermally connected to a heating element, heat reception by the heat pipes cannot be equalized since an amount of heat received by the heat pipes varies depending on a distance from the heating element. Thus, there is a case where sufficient cooling performance is not acquired. Also, there is an R portion on an outer peripheral surface of each heat pipe, and a void generated on an outer side of the R portion does not contribute to heat transport by the heat pipe group. Thus, a volume of a heat receiving portion in the heat pipe group is not sufficiently acquired and there is also a case where sufficient cooling performance is not acquired.

Also, since many components are mounted at high density on a substrate, there is a case where a forbidden region where a different component or the like is attached exists in an installation space of a heatsink. When a heat insulating portion and a heat radiating portion of a heat pipe group are transferred in a direction away from the substrate in order to avoid the forbidden region on the substrate, the heat pipe group cannot be thermally connected to central portions of heat radiating fins in an installation space in a narrow space. Thus, there is a case where heat radiation performance of the heat radiating fins is not sufficiently acquired. Also, when the heat insulating portion and the heat radiating portion of the heat pipe group are transferred in a direction away from the substrate, the number of installed heat radiating fins is limited in an installation space in a narrow space. Thus, there is also a case where heat radiation performance of the heat radiating fins is sufficiently acquired.

On the other hand, when the heat radiating portion of the heat pipe group is not transferred in a direction away from the substrate and only the heat insulating portion is transferred in a direction away from the substrate in order to acquire heat radiation performance of the heat radiating fins, a top heat position in which the heat radiating portion of the heat pipe group is on a lower side in a gravity direction compared to the heat receiving portion is acquired. When the heat pipe group is in the top heat position, there is a case where reflux of a working fluid, a phase of which is changed from a gas phase to a liquid phase in the heat radiating portion, to the heat receiving portion is blocked and dry-out is generated in the heat receiving portion.

SUMMARY

In view of the above situation, the present disclosure is to provide a heatsink that can improve heat radiation performance of a heat radiating fin group while preventing dry-out of a heat receiving portion and can equalize a heat input in the heat receiving portion in an environment with a limited installation space for the heatsink even when a forbidden region exists in the installation space.

A summary of a configuration of a heatsink of the present disclosure is as follows.

[1] A heatsink including:

a heat transport member having a heat receiving portion thermally connected to a heating element; and a heat radiating fin group which is connected to a heat radiating portion of the heat transport member and in which a plurality of heat radiating fins is arranged, wherein the heat transport member has an integral internal space that communicates from the heat receiving portion to the heat radiating portion and that is filled with a working fluid, a wick structure extended from the heat receiving portion to the heat radiating portion is housed in the internal space of the heat transport member, and the heat transport member has a heat radiating-side step portion, in which a step is provided in a direction that is not a direction parallel to a heat transport direction of the heat transport member, between a heat insulating portion placed between the heat receiving portion and the heat radiating portion and the heat radiating portion, the heat radiating portion being placed on a side of an installation surface of the heatsink compared to the heat insulating portion. [2] The heatsink according to [1], further including a heat transport member having the heat receiving portion thermally connected to the heating element, a pipe body connected to a heat radiating portion of the heat transport member, and a heat radiating fin group which is thermally connected to the pipe body and in which the plurality of heat radiating fins is arranged, wherein the heat transport member has an integral internal space that communicates from the heat receiving portion to a connection portion with the pipe body and that is filled with the working fluid, the internal space of the heat transport member communicating with an internal space of the tubular body, the wick structure extended from the heat receiving portion to the heat radiating portion is housed in the internal space of the heat transport member, and the heat transport member has the heat radiating-side step portion, in which a step is provided in a direction that is not the direction parallel to a heat transport direction of the heat transport member, between the heat insulating portion placed between the heat receiving portion and the heat radiating portion and the heat radiating portion, the heat radiating portion being placed on a side of an installation surface of the heatsink compared to the heat insulating portion.

[3] The heatsink according to [1] or [2], wherein the wick structure has a first step portion that follows the step of the heat radiating-side step portion.

[4] The heatsink according to any one of [1] to [3], further including a heat receiving-side step portion, in which a step is provided in a direction that is not the direction parallel to the heat transport direction of the heat transport member, between the heat receiving portion and the heat insulating portion.

[5] The heatsink according to [4], wherein the wick structure further includes a second step portion that follows the step of the heat receiving-side step portion.

[6] The heatsink according to any one of [3] to [5], wherein the wick structure in the first step portion is more widened, in a direction orthogonal to the heat transport direction of the heat transport member, than the wick structure in positions of the heat insulating portion and the heat radiating portion.

[7] The heatsink according to [2], wherein the pipe body is extended in an arrangement direction of the heat radiating fins.

[8] The heatsink according to [2], wherein an extension direction of the pipe body is not parallel to the heat transport direction of the heat transport member.

[9] The heatsink according to [2], wherein a plurality of the pipe bodies is provided and extended in a plurality of directions from the heat transport member.

[10] The heatsink according to any one of [1] to [9], wherein at least one surface of the heat transport member has a planar shape.

In the above aspect, in a heat transport member, a part thermally connected to a heating element to be cooled functions as a heat receiving portion, and a part connected to a pipe body functions as a heat radiating portion of the heat transport member. A working fluid receives heat from a heating element and a phase of which is changed from a liquid phase to a gas phase in the heat receiving portion of the heat transport member, and a part of the gas-phase working fluid emits latent heat and the phase of which is changed from the gas phase to the liquid phase in the heat radiating portion of the heat transport member. In an aspect of a heatsink of the present disclosure, heat of a heating element is transported by a heat transport member from a heat receiving portion of the heat transport member to a heat radiating portion of the heat transport member, and is further transported from the heat radiating portion of the heat transport member to a pipe body. Also, a working fluid a phase of which is changed into the gas phase by reception of heat from the heating element by the heat transport member flows from the heat transport member to the pipe body. When the gas-phase working fluid flows from the heat transport member to the pipe body, the pipe body receives heat from the heat transport member and further transfers the heat received from the heat transport member to a heat radiating fin group. When the pipe body transfers the heat received from the heat transport member to the heat radiating fin group, the phase of the gas-phase working fluid flowing from the heat transport member to the pipe body is changed into the liquid phase. The heat transferred from the pipe body to the heat radiating fin group is released from the heat radiating fin group to an environment outside the heatsink. Also, in the above aspect, the heat transport member has a heat radiating-side step portion, in which a step is provided in a direction that is not a direction parallel to a heat transport direction, between a heat insulating portion and the heat radiating portion, and the heat radiating portion is placed on a side of an installation surface of the heatsink compared to the heat insulating portion. Thus, the heat radiating portion is not placed on the same plane as the heat insulating portion.

In an aspect of a heatsink of the present disclosure, an entire internal space of a heat transport member having a heat receiving portion communicates and is integrated unlike an internal space of a heat pipe group in which a plurality of heat pipes is arranged in parallel. Thus, according to the aspect of the heatsink of the present disclosure in which heatsink the heat transport member having the integral internal space transports heat of a heating element from the heat receiving portion to a connection portion with a pipe body thermally connected to a heat radiating fin, a reflux characteristic of a liquid-phase working fluid is good, and a heat input in the heat receiving portion can be equalized and thermal resistance in the heat receiving portion can be reduced even when an amount of heat generated by the heating element is increased. Also, according to an aspect of the heatsink of the present disclosure, a wick structure extended from a heat receiving portion to a heat radiating portion is housed in the internal space of the heat transport member. Also, since a heat radiating-side step portion in which a step is provided in a direction that is not a direction parallel to a heat transport direction is included between a heat insulating portion and the heat radiating portion of the heat transport member, the heat radiating portion is placed on a side of an installation surface of the heatsink compared to the heat insulating portion. Thus, in an environment with a limited installation space for the heatsink, it is possible to improve heat radiation performance of a heat radiating fin group thermally connected to the heat radiating portion of the heat transport member while preventing dry-out of the heat receiving portion even when a forbidden region exists in the installation space. Also, according to the aspect of the heatsink of the present disclosure, the entire internal space of the heat transport member communicates and is integrated. Thus, it is possible to uniformly cool the entire heating element even when heat is generated unevenly in the heating element.

According to an aspect of the heatsink of the present disclosure, the wick structure has a first step portion that follows the step of the heat radiating-side step portion. Thus, reflux of a liquid-phase working fluid from the heat radiating portion to the heat-receiving portion is further smoothed, and dry-out of the heat receiving portion can be more securely prevented.

According to an aspect of the heatsink of the present disclosure, the heat transport member further has a heat receiving-side step portion, in which a step is provided in a direction that is not the direction parallel to the heat transport direction of the heat transport member, between the heat receiving portion and the heat insulating portion. Thus, the forbidden region in the installation space can be avoided more securely.

According to an aspect of the heatsink of the present disclosure, the wick structure further includes a second step portion that follows the step of the heat receiving-side step portion. Thus, it is possible to further smooth reflux of the liquid-phase working fluid from the heat radiating portion to the heat receiving portion while more securely avoiding the forbidden region in the installation space.

According to an aspect of the heatsink of the present disclosure, the wick structure is widened, in the first step portion, in a direction orthogonal to the heat transport direction of the heat transport member. Thus, reflux of the liquid-phase working fluid from the heat radiating portion to the heat insulating portion becomes smoother.

According to an aspect of the heatsink of the present disclosure, the pipe body communicating with the internal space of the heat transport member is extended in an arrangement direction of the heat radiating fin. Thus, a gas-phase working fluid flows in the arrangement direction of the heat radiating fin in the pipe body. Thus, heat radiation efficiency of the heat radiating fin group is improved, and cooling performance of the heatsink is securely improved.

According to an aspect of the heatsink of the present disclosure, an extension direction of the pipe body is not parallel to the heat transport direction of the heat transport member. Thus, heat transported from the heat transport member is transported in a direction different from the extension direction (heat transport direction) of the heat transport member. Thus, it is possible to prevent an increase in a size of the heatsink in the extension direction (heat transport direction) of the heat transport member. As a result, a space can be saved.

According to an aspect of the heatsink of the present disclosure, a plurality of the pipe bodies is extended in a plurality of directions from the heat transport member. Thus, heat transported from the heat transport member to the pipe bodies is transported in the plurality of directions different from the extension direction (heat transport direction) of the heat transport member. Thus, it is possible to more securely prevent an increase in a size of the heatsink in the extension direction (heat transport direction) of the heat transport member.

DETAILED DESCRIPTION

Figure 1:
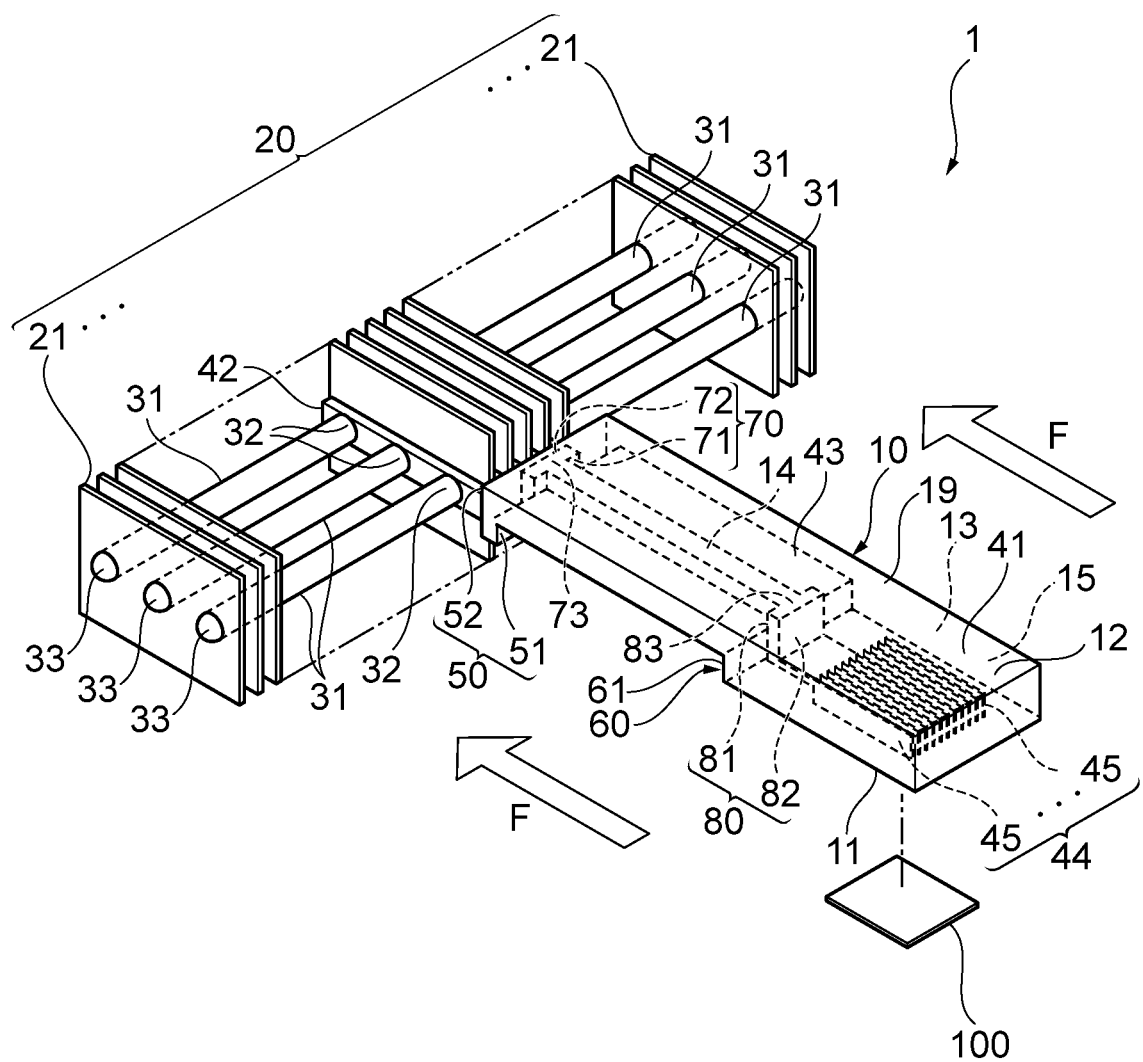
FIG. 1 A perspective view for describing an outline of a heatsink according to a first embodiment of the present disclosure.
Figure 2:
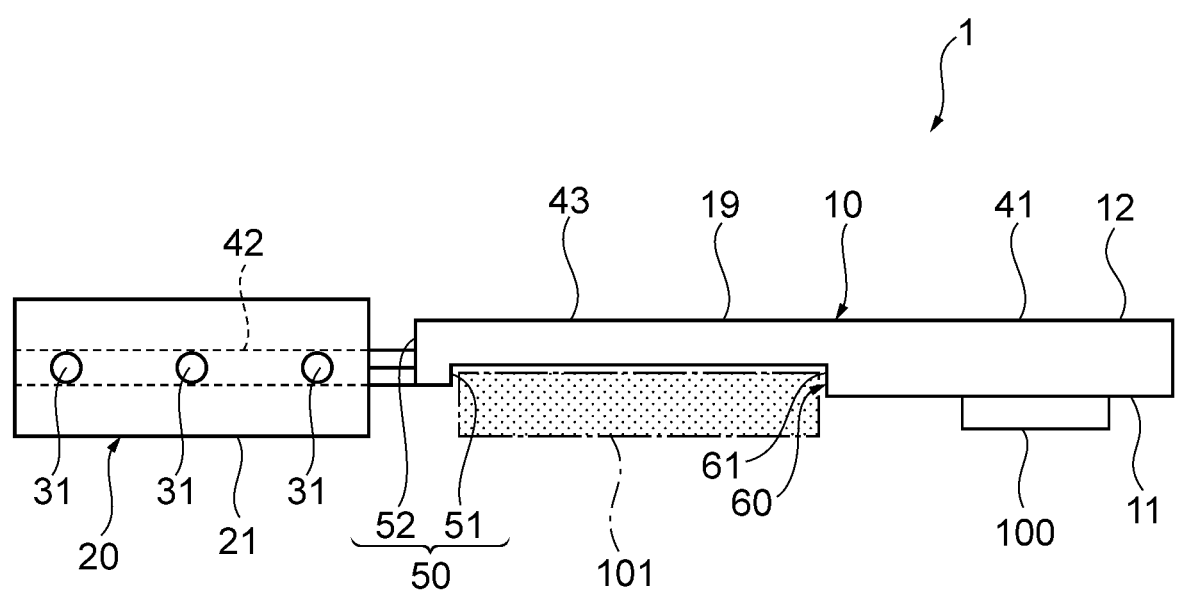
FIG. 2 A side view for describing the outline of the heatsink according to the first embodiment of the present disclosure.
Figure 3:
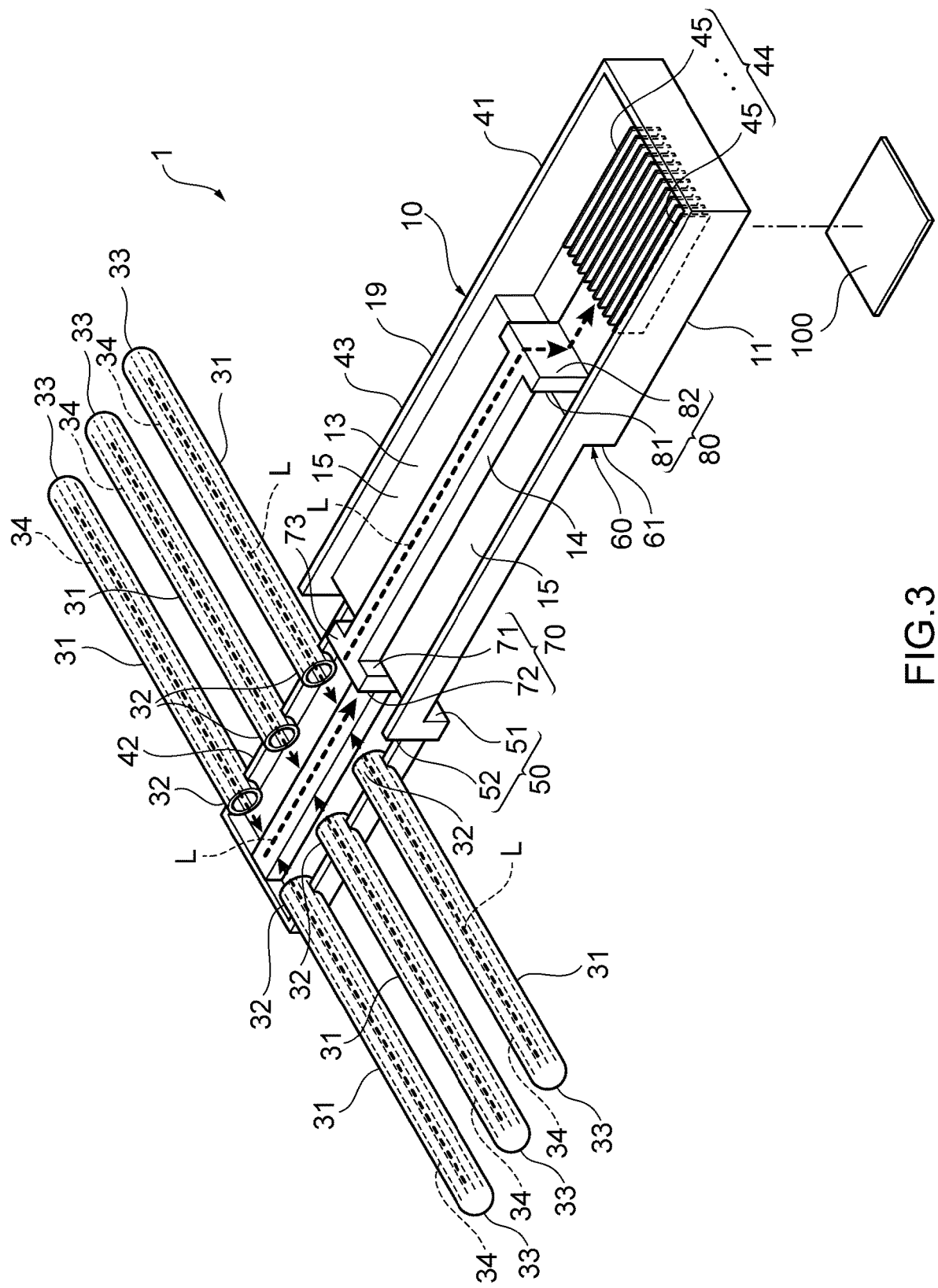
FIG. 3 A perspective view for describing an outline of an inside of the heatsink according to the first embodiment of the present disclosure.
Figure 4:
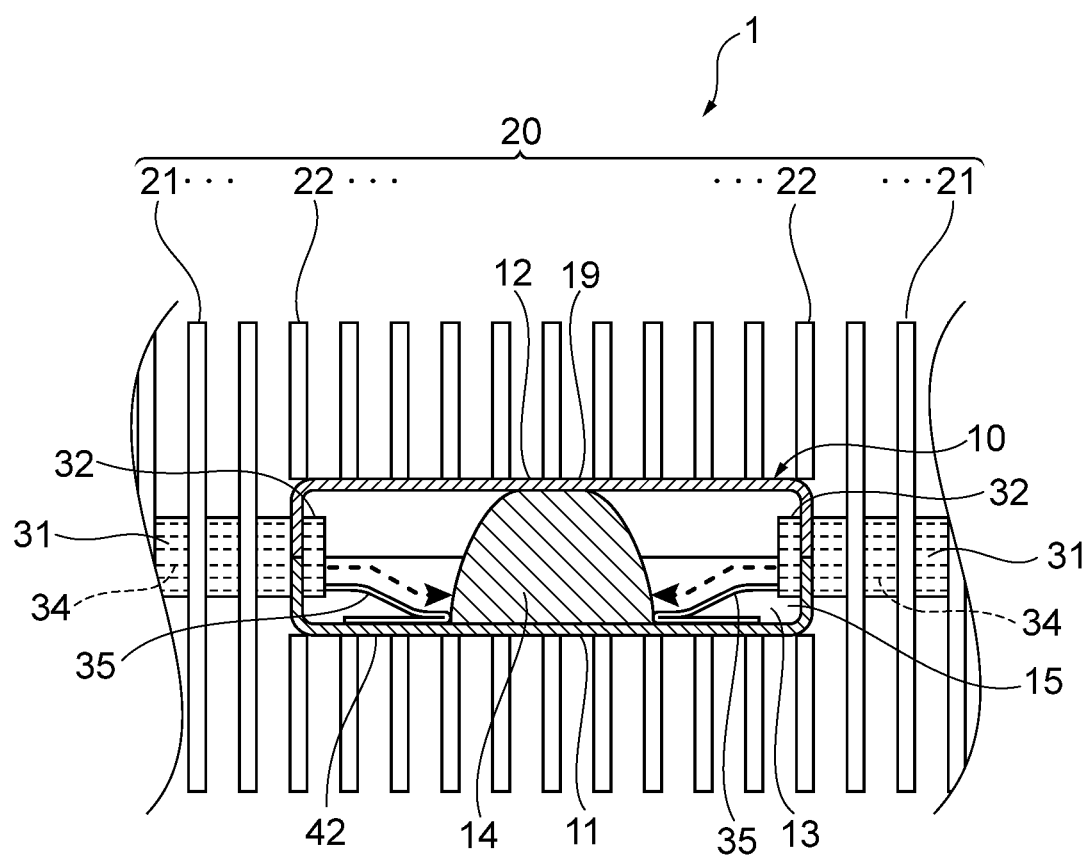
FIG. 4 A view for describing an outline of a connection portion between a heat transport member and a pipe body of the heatsink according to the first embodiment of the present disclosure.
Figure 5:
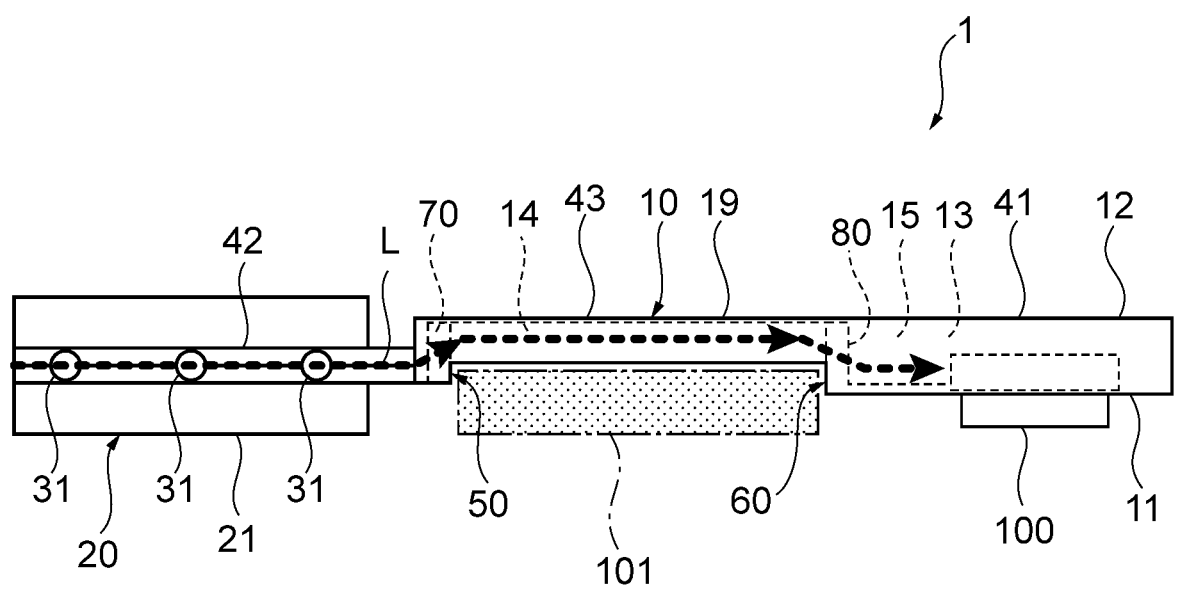
FIG. 5 A side view for describing an outline of the inside of the heatsink according to the first embodiment of the present disclosure.

In the following, heatsinks according to embodiments of the present disclosure will be described with reference to the drawings. First, a heatsink according to a first embodiment of the present disclosure will be described. Note that FIG. 1 is a perspective view for describing an outline of the heatsink according to the first embodiment of the present disclosure. FIG. 2 is a side view for describing the outline of the heatsink according to the first embodiment of the present disclosure. FIG. 3 is a perspective view for describing an outline of an inside of the heatsink according to the first embodiment of the present disclosure. FIG. 4 is a view for describing an outline of a connection portion between a heat transport member and a pipe body of the heatsink according to the first embodiment of the present disclosure. FIG. 5 is a side view for describing the outline of the inside of the heatsink according to the first embodiment of the present disclosure.

As illustrated in FIGS. 1 and 2, a heatsink 1 according the first embodiment of the present disclosure includes a heat transport member 10 having a heat receiving portion 41 that is thermally connected to a heating element 100, a heat radiating fin group 20 thermally connected to the heat transport member 10, and a pipe body 31 thermally connected to the heat radiating fin group 20. The heat radiating fin group 20 includes a plurality of first heat radiating fins 21, 21, . . . attached to the pipe body 31, and a plurality of second heat radiating fins 22, 22, . . . attached to the heat transport member 10. In a heat radiating portion 42 of the heat transport member 10, the pipe body 31 is connected to the heat transport member 10. Also, an internal space of the heat transport member 10 communicates with an internal space of the pipe body 31. That is, in the heatsink 1, the heat transport member 10 has an integral internal space that communicates from the heat receiving portion 41 to a connection portion with the pipe body 31 and that is filled with a working fluid.

As illustrated in FIGS. 1 and 2, the heat transport member 10 includes a container 19 having a hollow cavity 13 and a working fluid (not illustrated) flowing in the cavity 13. Also, a wick structure 14 having capillary force is housed in the cavity 13. The container 19 is formed by joining of one plate-like body 11 placed on a side of an installation surface of the heatsink 1 and the other plate-like body 12 facing one plate-like body 11.

One plate-like body 11 has a plate shape having a side wall erected from a plane portion at an edge of the plane portion. The other plate-like body 12 also has a plate shape having a side wall erected from a plane portion at an edge of the plane portion. Thus, each of the one plate-like body 11 and the other plate-like body 12 has a recessed shape. The cavity 13 of the container 19 is formed by joining of the one plate-like body 11 and the other plate-like body 12 with the recessed shapes facing each other. Thus, a shape of the container 19 is planar. The cavity 13 of the container 19 is an internal space that is sealed from an external environment, and is depressurized by deaeration processing.

A part of an outer surface of the container 19 to which part the heating element 100 to be cooled is thermally connected functions as the heat receiving portion 41. Since the heating element 100 is thermally connected to the container 19, the heating element 100 is cooled. In the heat transport member 10, the heat receiving portion 41 is formed at one end since the heating element 100 is thermally connected to the one end. Also, on an inner surface of the container 19, the heat receiving portion 41 is provided with a heat receiving portion inner surface area increasing portion 44. The heat receiving portion inner surface area increasing portion 44 is a part in which recesses and protrusions are repeatedly formed. In the heatsink 1, a plurality of plate-like fins 45, 45 . . . is provided in an erected manner on an inner surface of the one plate-like body 11. Since the heat receiving portion 41 is provided with the heat receiving portion inner surface area increasing portion 44, heat transfer from the heat receiving portion 41 to a liquid-phase working fluid becomes smooth.

The heat transport member 10 is extended in a predetermined direction from a position of the heating element 100, and a second heat radiating fin 22 forming the heat radiating fin group 20 is thermally connected to the other end opposite to the one end. The other end of the heat transport member 10 to which the heat radiating fin group 20 is thermally connected functions as the heat radiating portion 42 of the heat transport member 10.

In the heat transport member 10, an intermediate portion placed between the heat receiving portion 41 placed at the one end of the container 19 and the heat radiating portion 42 placed at the other end of the container 19 functions as a heat insulating portion 43. The heat insulating portion 43 is a part to which neither the heat radiating fin group 20 nor the heating element 100 is thermally connected. Heat transferred from the heating element 100 to the heat receiving portion 41 is transported from the heat receiving portion 41 to the heat radiating portion 42 in an extension direction of the heat insulating portion 43.

A heat radiating-side step portion 50 is provided between the heat insulating portion 43 and the heat radiating portion 42 of the heat transport member 10. The heat radiating-side step portion 50 is a part where a step is provided in a direction that is not a direction parallel to a heat transport direction of the heat transport member 10. In the heatsink 1, the heat radiating-side step portion 50 is a step in a direction substantially orthogonal to the heat transport direction of the heat transport member 10. Also, the heat radiating-side step portion 50 is a step in a direction substantially vertical to the installation surface of the heatsink 1. Moreover, the heat radiating-side step portion 50 is a step in a direction of the installation surface of the heatsink 1 from the heat insulating portion 43 toward the heat radiating portion 42. Since the heat radiating-side step portion 50 is provided between the heat insulating portion 43 and the heat radiating portion 42 of the heat transport member 10, it is possible to install the heatsink 1 while avoiding a forbidden region 101 in an environment with a limited installation space for the heatsink 1 even when the forbidden region 101 exists in the installation space.

The heat radiating-side step portion 50 is formed of a step portion 51 that is a step in a direction substantially orthogonal to the heat transport direction of the heat transport member 10 which step is provided in the one plate-like body 11, and a step portion 52 that is a step in a direction substantially orthogonal to the heat transport direction of the heat transport member 10 which step is provided in the other plate-like body 12. Thus, the heat insulating portion 43 and the heat radiating portion 42 are not placed on the same plane in the one plate-like body 11. Also, the heat insulating portion 43 and the heat radiating portion 42 are not placed on the same plane in the other plate-like body 12. From the above, the heat radiating portion 42 is placed on a side of an installation surface of the heatsink 1 compared to the heat insulating portion 43.

Also, as illustrated in FIGS. 1 and 2, a heat receiving-side step portion 60 is provided between the heat insulating portion 43 and the heat receiving portion 41 of the heat transport member 10 in the heatsink 1. The heat receiving-side step portion 60 is a part where a step is provided in a direction that is not the direction parallel to the heat transport direction of the heat transport member 10. In the heatsink 1, the heat receiving-side step portion 60 is a step in a direction substantially orthogonal to the heat transport direction of the heat transport member 10. Also, the heat receiving-side step portion 60 is a step in a direction substantially vertical to the installation surface of the heatsink 1. Moreover, the heat receiving-side step portion 60 is a step in a direction of the installation surface of the heatsink 1 from the heat insulating portion 43 toward the heat receiving portion 41.

The heat receiving-side step portion 60 is formed of a step portion 61 that is a step in a direction substantially orthogonal to the heat transport direction of the heat transport member 10 which step is provided in the one plate-like body 11. A step that forms the heat receiving-side step portion 60 is not provided in the other plate-like body 12. Thus, the heat insulating portion 43 and the heat receiving portion 41 are not placed on the same plane in the one plate-like body 11. On the other hand, the heat insulating portion 43 and the heat receiving portion 41 are placed on the same plane in the other plate-like body 12.

A size in a width direction of the heat transport member 10 is not specifically limited, and the heat receiving portion 41, the heat insulating portion 43, and the heat radiating portion 42 have substantially the same size in the heatsink 1. Also, a size in the width direction of the heat transport member 10 in the heat receiving portion 41 can be arbitrarily selected according to a size in a width direction of the heating element 100, or the like.

As illustrated in FIGS. 1 and 3, the wick structure 14 is extended from the heat receiving portion 41 to the heat radiating portion 42 of the container 19 in a central portion in the width direction of the heat transport member 10. Also, the wick structure 14 has a first step portion 70 that follows the step of the heat radiating-side step portion 50. That is, the first step portion 70 is provided in a part of the wick structure 14 which part is placed between the heat insulating portion 43 and the heat radiating portion 42 of the heat transport member 10. The step of the first step portion 70 is provided in a direction that is not the direction parallel to the heat transport direction of the heat transport member 10. In the heatsink 1, the first step portion 70 is a step in a direction substantially orthogonal to the heat transport direction of the heat transport member 10 in a manner of corresponding to the heat radiating-side step portion 50 being a step in the direction substantially orthogonal to the heat transport direction of the heat transport member 10. Also, the first step portion 70 is a step in a direction substantially vertical to the installation surface of the heatsink 1 in such a manner as to correspond to the heat radiating-side step portion 50 being a step in the direction substantially vertical to the installation surface of the heatsink 1. Moreover, the first step portion 70 is a step in a direction of the installation surface of the heatsink 1 from the heat insulating portion 43 to the heat radiating portion 42 in such a manner as to correspond to the heat radiating-side step portion 50 being a step in the direction of the installation surface of the heatsink 1 from the heat insulating portion 43 to the heat radiating portion 42.

The first step portion 70 is formed of a step portion 71 that is a step provided on a side of the heat insulating portion 43 and in a direction substantially orthogonal to the heat transport direction of the heat transport member 10, and a step portion 72 that is a step provided on a side of the heat radiating portion 42 and in a direction substantially orthogonal to the heat transport direction of the transport member 10. Thus, in the wick structure 14, a part placed in the heat insulating portion 43 and a part placed in the heat radiating portion 42 are not placed on the same plane on a side of the one plate-like body 11. Also, in the wick structure 14, a part placed in the heat insulating portion 43 and a part placed in the heat radiating portion 42 are not placed on the same plane even on a side of the other plate-like body 12. From the above, in the wick structure 14, the part placed in the heat radiating portion 42 is placed on the side of the installation surface of the heatsink 1 compared to the part placed on the heat insulating portion 43.

Also, as illustrated in FIGS. 1 and 3, the wick structure 14 has a second step portion 80 that follows the step of the heat receiving-side step portion 60. That is, the second step portion 80 is provided in a part placed between the heat insulating portion 43 and the heat receiving portion 41 of the heat transport member 10. A step of the second step portion 80 is provided in a direction that is not the direction parallel to the heat transport direction of the heat transport member 10. In the heatsink 1, the second step portion 80 is a step in a direction substantially orthogonal to the heat transport direction of the heat transport member 10 in such a manner as to correspond to the heat receiving-side step portion 60 being a step in the direction substantially orthogonal to the heat transport direction of the heat transport member 10. Also, the second step portion 80 is a step in a direction substantially vertical to the installation surface of the heatsink 1 in such a manner as to correspond to the heat receiving-side step portion 60 being a step in the direction substantially vertical to the installation surface of the heatsink 1. Moreover, the second step portion 80 is a step in the direction of the installation surface of the heatsink 1 from the heat insulating portion 43 toward the heat receiving portion 41 in such a manner as to correspond to the heat receiving-side step portion 60 being a step in the direction of the installation surface of the heatsink 1 from the heat insulating portion 43 to the heat receiving portion 41.

The second step portion 80 is formed of a step portion 81 that is a step provided on a side of the heat insulating portion 43 and in a direction substantially orthogonal to the heat transport direction of the heat transport member 10, and a step portion 82 that is a step provided on a side of the heat receiving portion 41 and in a direction substantially orthogonal to the heat transport direction of the transport member 10. Thus, in the wick structure 14, a part placed in the heat insulating portion 43 and a part placed in the heat receiving portion 41 are not placed on the same plane on a side of the one plate-like body 11. Also, in the wick structure 14, a part placed in the heat insulating portion 43 and a part placed in the heat receiving portion 41 are not placed on the same plane on a side of the other plate-like body 12. From the above, in the wick structure 14, the part placed in the heat receiving portion 41 is placed on the side of the installation surface of the heatsink 1 compared to the part placed in the heat insulating portion 43.

The wick structure 14 is not specifically limited, and examples thereof include a sintered body of metal powder such as copper powder, a metal mesh made of a metal wire, a groove (plurality of narrow groove), a nonwoven fabric, a metal fiber, and the like. In the heat transport member 10, a sintered body of metal powder is used as the wick structure 14. A part of the cavity 13 in which part the wick structure 14 is not provided functions as a steam flow channel 15 through which a gas-phase working fluid flows. The steam flow channel 15 is extended from the heat receiving portion to the heat radiating portion of the container 19 in such a manner as to correspond to the wick structure 14 being extended from the heat receiving portion to the heat radiating portion of the container 19. The heat transport member 10 transports heat of the heating element 100, which heat is received by the heat receiving portion 41, from the heat receiving portion 41 to the heat radiating portion 42 by a heat transport characteristic due to an operation of the working fluid.

As illustrated in FIGS. 1 to 3, pipe bodies 31 internal spaces of which communicate with the cavity 13 of the container 19 are provided at the other end of the heat transport member 10. Thus, a space from the cavity 13 to the inside of the pipe bodies 31 is filled with the working fluid flowing in the cavity 13. A shape of the pipe bodies 31 is not specifically limited, and has a linear shape in a longitudinal direction and has a circular shape in a direction orthogonal to the longitudinal direction (in radial direction) in the heatsink 1. Also, all of the pipe bodies 31 have the same shape and size.

The pipe bodies 31 are extended in a direction substantially orthogonal to the heat transport direction of the heat transport member 10 along a plane direction of the heat radiating portion 42 of the heat transport member 10. Thus, the pipe bodies 31 are placed on the side of the installation surface of the heatsink 1 compared to the heat insulating portion 43. In the heatsink 1, heat transported from the heat transport member 10 is transported by the pipe bodies 31 in a direction different from the extension direction of the heat transport member 10 since the extension direction of the pipe bodies 31 is not parallel to the heat transport direction of the heat transport member 10. Thus, it is possible to prevent an increase in a size of the heatsink 1 in the extension direction (heat transport direction) of the heat transport member 10 and to save a space of the heatsink 1.

Also, the plurality of pipe bodies 31 is provided and is extended in a plurality of directions from the heat radiating portion 42 of the heat transport member 10. In the heatsink 1, the pipe bodies 31 are extended in both right and left directions, that is, two directions with the heat transport member 10 as a center. Also, the same number of pipe bodies 31 are respectively provided in the right and left directions with the heat transport member 10 as the center. Since the plurality of pipe bodies 31 is extended from the heat transport member 10 in a plurality of directions (two direction in heatsink 1), heat transported from the heat transport member 10 is transported in a plurality of directions (two direction in heatsink 1) different from the extension direction of the heat transport member 10. Thus, an increase in a size of the heatsink 1 in the extension direction of the heat transport member 10 can be more securely prevented.

An end portion 32 on a side of the cavity 13 (hereinafter, also referred to as "base portion") of each of the pipe bodies 31 is opened, and an end portion 33 on an opposite side to the cavity 13 (hereinafter, also referred to as "leading-end portion") is closed. Also, the cavity 13 of the container 19 and an internal space of the pipe body 31 communicate with each other, and the internal space of the pipe body 31 is depressurized by deaeration processing as in the case of the cavity 13. Thus, the working fluid can flow between the cavity 13 of the container 19 and the internal spaces of the pipe bodies 31.

Also, a through hole (not illustrated) for attachment of a pipe body 31 to the container 19 is formed in a side surface portion of the container 19. A shape and size of the through hole correspond to a shape and size of the pipe body 31. By insertion of the base portion 32 of the pipe body 31 into the through hole of the container 19, the pipe body 31 is connected to the container 19. Thus, the pipe body 31 and the container 19 include different members. A method of fixing the pipe body 31 attached to the container 19 is not specifically limited, and examples thereof include welding, soldering, brazing, and the like.

In the heatsink 1, the pipe body 31 and the heat transport member 10 include different members. Thus, an arrangement, shape, size, and the like of the pipe body 31 can be freely selected, and a degree of freedom in designing of the heatsink 1 is improved. Also, in the heatsink 1, since the pipe body 31 can be attached to the container 19 by insertion of the pipe body 31 into the through hole in the container 19, assembly is easy.

As illustrated in FIG. 3, a different wick structure 34 that generates capillary force and is different from the wick structure 14 housed in the container 19 is provided on the inner surface of the pipe body 31. The different wick structure 34 is not specifically limited, and examples thereof include a sintered body of metal powder such as copper powder, a metal mesh made of a metal wire, a groove, a nonwoven fabric, a metal fiber, and the like. In the pipe body 31, a plurality of narrow grooves is formed as the wick structure 34 in such a manner as to cover the entire inner surface of the pipe body 31. The narrow grooves are extended in a longitudinal direction of the pipe body 31.

As illustrated in FIG. 4, the wick structure 14 provided in the heat transport member 10 and the different wick structure 34 provided in the pipe body 31 may be connected via a connection member 35. A working fluid a phase of which is changed from a gas phase to a liquid phase inside the pipe body 31 flows back from the leading-end portion 33 of the pipe body 31 in a direction of the base portion 32 in the different wick structure 34 by the capillary force of the different wick structure 34 in the pipe body 31. The liquid-phase working fluid that flows back to the base portion 32 of the pipe body 31 flows from the different wick structure 34 to one end of the connection member 35. The liquid-phase working fluid that flows from the different wick structure 34 to the one end of the connection member 35 can flow from the one end to the other end in the connection member 35, and can flow back from the other end of the connection member 35 to the wick structure 14 of the heat transport member 10.

Thus, by provision of the connection member 35, the liquid-phase working fluid can smoothly flow back from the different wick structure 34 to the heat receiving portion 41 of the heat transport member 10. As described above, since the connection member 35 improves flowing performance of the liquid-phase working fluid between the pipe body 31 and the heat transport member 10, cooling performance of the heatsink 1 is improved. Examples of the connection member 35 include a wick member having capillary force and more specifically include a metal mesh, a braided metal wire, a metal fiber, and the like.

Examples of materials of the container 19 and the pipe body 31 include copper, a copper alloy, aluminum, an aluminum alloy, nickel, a nickel alloy, stainless steel, titanium, a titanium alloy, and the like. The working fluid to fill the cavity 13 of the container 19 and the internal space of the pipe body 31 can be arbitrarily selected according to compatibility with the materials of the container 19 and the pipe body 31, and examples thereof include water, fluorocarbons, hydrofluoroether (HFE), cyclopentane, ethylene glycol, a mixture thereof, and the like.

A thickness of the container 19 can be arbitrarily selected according to mechanical strength, weight, and the like and can be, for example, 0.5 to 3 mm. A width of the heat transport member 10 can be, for example, 4 to 20 mm. Also, a diameter of the pipe body 31 can be arbitrarily selected according to mechanical strength, weight, and the like and can be, for example, 5 to 10 mm.

As illustrated in FIG. 1, in the heat radiating fin group 20, a plurality of first heat radiating fins 21, 21, . . . and a plurality of second heat radiating fins 22, 22, . . . are formed and arranged in parallel. Both the first heat radiating fins 21 and the second heat radiating fins 22 are thin flat plate-like members. Among these, first heat radiating fins 21 placed on both side portions in the heat radiating fin group 20 are arranged in parallel at a predetermined interval in a direction substantially parallel to a longitudinal direction of pipe bodies 31. Thus, the pipe bodies 31 are extended in an arrangement direction of the first heat radiating fins 21. Also, the first heat radiating fins 21 are respectively attached and fixed to positions of the pipe bodies 31, and are thermally connected to the pipe bodies 31. All of the first heat radiating fins 21 have the same shape and size. The second heat radiating fins 22 placed in a central portion of the heat radiating fin group 20 are attached and fixed to the position of the heat transport member 10, and is thermally connected to the heat transport member 10. A part of the heat transport member 10 to which part the second heat radiating fins 22 are attached functions as the heat radiating portion 42. The second heat radiating fins 22 are attached in an erected manner to the heat transport member 10.

A main surface of each of the first heat radiating fins 21 is a surface that mainly has a heat radiating function of the first heat radiating fin 21. A main surface of each of the second heat radiating fins 22 is a surface that mainly has a heat radiating function of the second heat radiating fin 22. The main surfaces of the first heat radiating fins 21 and the main surfaces of the second heat radiating fins 22 are arranged in such a manner as to be in a direction substantially orthogonal to the extension direction, that is, the longitudinal direction of the pipe bodies 31. A method of thermally connecting the first heat radiating fins 21 to the pipe bodies 31 is not specifically limited, and any known method can be used. For example, a method of forming through holes (not illustrated) in the first heat radiating fins 21 and inserting the pipe bodies 31 into the through holes is used.

As illustrated in FIGS. 1 and 2, the pipe bodies 31 can be inserted into substantially central portions in a height direction of the first heat radiating fins 21 in such a manner as to correspond to the pipe bodies 31 being placed on the side of the installation surface of the heatsink 1 compared to the heat insulating portion 43. That is, the pipe bodies 31 are thermally connected to the substantially central portions in the height direction of the first heat radiating fins 21. Thus, heat radiation performance of the first heat radiating fins 21 can be improved compared to a case where the pipe bodies 31 are inserted into upper portions in the height direction of the first heat radiating fins 21.

A method of thermally connecting the second heat radiating fins 22 to the heat transport member 10 is not specifically limited, and any known method can be used. For example, a method of providing the heat radiating fins 22 in an erected manner in the heat transport member 10 by providing, at end portions of the second heat radiating fins 22, fixing pieces extended in a direction vertical to the main surfaces of the heat radiating fins 22 and by connecting the fixing pieces to a plane of the heat transport member 10 can be used.

The heatsink 1 is forcibly air-cooled by a blower fan (not illustrated), for example. Cooling air F derived from the blower fan is supplied in a direction substantially parallel to the heat transport direction of the heat transport member 10. The cooling air F is supplied along the main surfaces of the first heat radiating fins 21 and the main surfaces of the second heat radiating fins 22, and the heat radiating fin group 20 is cooled.

A material of the first heat radiating fins 21 and the second heat radiating fins 22 is not specifically limited, and examples thereof include metal such as copper, a copper alloy, aluminum, and an aluminum alloy, a carbon material such as graphite, a composite member using the carbon material, and the like.

Next, a mechanism of a cooling function of the heatsink 1 will be described with reference to FIGS. 1, 3, and 5. First, the heating element 100 that is an object to be cooled is thermally connected to one end of the container 19 of the heat transport member 10, and the one end is made to function as the heat receiving portion 41. When the one end of the container 19 receives heat from the heating element 100, the heat is transferred to the liquid-phase working fluid in the cavity 13 at the one end of the container 19, and the liquid-phase working fluid is changed into a gas-phase working fluid in the cavity 13 at the one end of the container 19. The gas-phase working fluid flows in the steam flow channel 15 from the one end of the container 19 to the other end that is the heat radiating portion 42. When the gas-phase working fluid flows from the one end to the other end of the container 19, the heat transport member 10 transports the heat from the one end to the other end. A part of the gas-phase working fluid that flows to the other end of the container 19 emits latent heat and is changed into a liquid-phase working fluid L, and the released latent heat is transferred to the second heat radiating fins 22 thermally connected to the heat transport member 10. The heat transferred to the second heat radiating fins 22 is released to an external environment of the heatsink 1 via the second heat radiating fins 22. Since the wick structure 14 has the first step portion 70 that follows the step of the heat radiating-side step portion 50, and the second step portion 80 that follows the step of the heat receiving-side step portion 60, the working fluid L the phase of which is changed into the liquid phase at the other end of the container 19 flows in the heat radiating-side step portion 50 and the heat receiving-side step portion 60 from the other end of the container 19 and flows back to the one end of the container 19 by the capillary force of the wick structure 14.

Also, since the cavity 13 of the container 19 and the internal spaces of the pipe bodies 31 communicate with each other, a working fluid a phase of which is not changed into the liquid phase at the other end of the container 19 in the gas-phase working fluid changed from the liquid-phase working fluid flows from the cavity 13 into the internal spaces of the pipe bodies 31. The gas-phase working fluid that flows into the internal spaces of the pipe bodies 31 releases latent heat inside the pipe bodies 31 and is changed into the liquid-phase working fluid L. The latent heat released inside the pipe body 31 is transferred to the first heat radiating fins 21 that are thermally connected to the pipe bodies 31. The heat transferred to the first heat radiating fins 21 is released to the external environment of the heatsink 1 via the first heat radiating fins 21. The working fluid L the phase of which is changed from the gas phase into the liquid phase inside the pipe bodies 31 flows back from the central portions and the leading-end portions 33 of the pipe bodies 31 to the base portions 32 of the pipe bodies 31 by the capillary force of the different wick structure 34 in the inner surfaces of the pipe bodies 31. The liquid-phase working fluid L that flows back to the base portions 32 of the pipe bodies 31 flows back to the wick structure 14 having the first step portion 70 and the second step portion 80 at the other end of the container 19. The liquid-phase working fluid L that flows back to the wick structure 14 flows through the heat radiating-side step portion 50 and the heat receiving-side step portion 60 from the other end of the container 19 and flows back to the one end of the container 19 by the capillary force of the wick structure 14.

In the heatsink 1, the entire cavity 13 of the heat transport member 10 communicates and is integrated unlike an internal space of the heat pipe group in which a plurality of heat pipes is arranged in parallel. Thus, in the heatsink 1, since the heat transport member 10 having the integral cavity 13 transports heat of the heating element 100 from the heat receiving portion 41 to the connection portion with the pipe bodies 31 thermally connected to the heat radiating fin group 20, a reflux characteristic of a liquid-phase working fluid is good, and a heat input in the heat receiving portion 41 can be equalized and thermal resistance in the heat receiving portion 41 can be reduced even when an amount of heat generated by the heating element 100 is increased. Also, in the heatsink 1, since the heat radiating-side step portion 50 is included between the heat insulating portion 43 and the heat radiating portion 42 of the heat transport member 10, the heat radiating portion 42 is placed on the side of the installation surface of the heatsink 1 compared to the heat insulating portion 43. Also, the wick structure 14 that is extended from the heat receiving portion 41 to the heat radiating portion 42 and that has the first step portion 70 following the step of the heat radiating-side step portion 50 is housed in the heat transport member 10. Thus, in an environment in which an installation space for the heatsink 1, more specifically, an installation space in a height direction of the heatsink 1 is limited, even when a forbidden region 101 exists in the installation space, it is possible to securely prevent dry-out of the heat receiving portion 41 while avoiding the forbidden region 101, and to improve heat radiation performance of the heat radiating fin group 20 thermally connected to the heat radiating portion 42 of the heat transport member 10. Also, in the heatsink 1, since the entire internal space of the heat transport member 10 communicates and is integrated, the entire heating element 100 can be uniformly cooled even when heat is generated unevenly in the heating element 100.

Also, in the heatsink 1, the forbidden region 101 in the installation space can be more securely avoided since the heat transport member 10 has the heat receiving-side step portion 60. Also, since the wick structure 14 has the second step portion 80 that follows the step of the heat receiving-side step portion 60, reflux of a liquid-phase working fluid from the heat radiating portion 42 to the heat receiving portion 41 becomes smoother.

Figure 6:
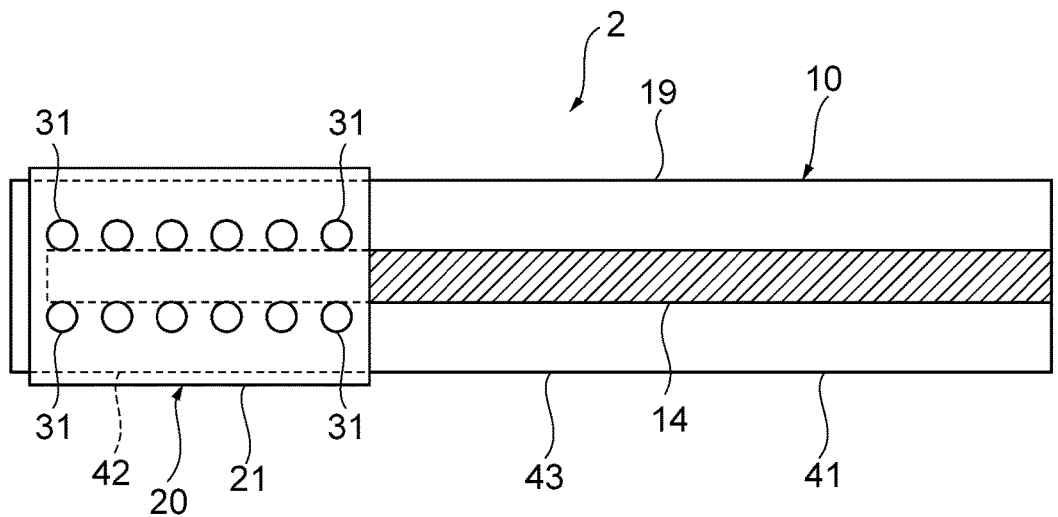
FIG. 6 A plan view for describing an outline of a heatsink according to a second embodiment of the present disclosure.
Figure 7:
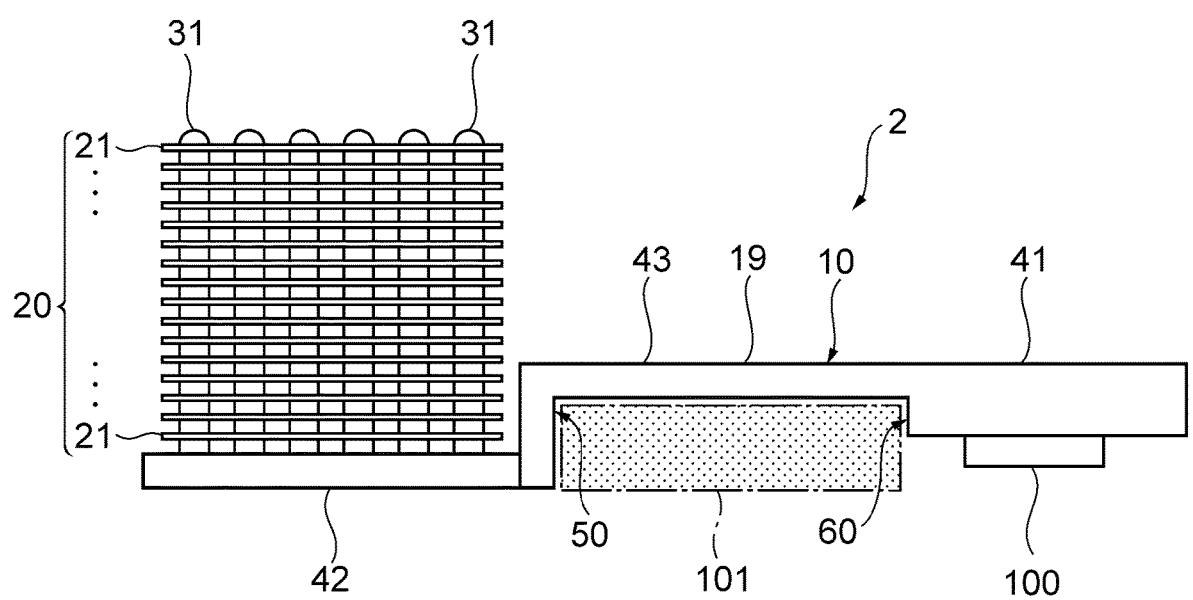
FIG. 7 A side view for describing the outline of the heatsink according to the second embodiment of the present disclosure.

Next, a heatsink according to a second embodiment of the present disclosure will be described with reference to the drawings. Note that since the heatsink according to the second embodiment has a main portion in common with that of a heatsink according to the first embodiment, the same reference sign is used to describe the same component. Note that FIG. 6 is a plan view for describing an outline of the heatsink according to the second embodiment of the present disclosure. FIG. 7 is a side view for describing the outline of the heatsink according to the second embodiment of the present disclosure.

In the heatsink according to the first embodiment, a pipe body is extended, along a plane direction of a planar heat transport member, in a direction substantially orthogonal to a heat transport direction of the planar heat transport member. Alternatively, as illustrated in FIGS. 6 and 7, in a heatsink 2 according to the second embodiment, a pipe body 31 is extended in a direction substantially orthogonal to a plane direction of a planar heat transport member 10 and in a direction substantially orthogonal to a heat transport direction of the planar heat transport member 10.

In the heatsink 2, a heat radiating fin group 20 includes a plurality of first heat radiating fins 21, 21, ... attached to the pipe body 31. The first heat radiating fins 21 are arranged in parallel at a predetermined interval in a direction substantially parallel to a longitudinal direction of the pipe body 31. Thus, the pipe bodies 31 are extended in an arrangement direction of the first heat radiating fins 21. Also, a heat radiating-side step portion 50 is a step in a direction of an installation surface of the heatsink 2 from a heat insulating portion 43 toward a heat radiating portion 42. Thus, heat radiation performance of the heat radiating fin group 20 is improved since the number of installed first heat radiating fins 21 can be increased.

In the heatsink 2, specifically, in an environment in which an installation space is limited in a width direction of the heatsink 2 although the installation space is enough in a height direction of the heatsink 2, even when a forbidden region 101 exists in the installation space, it is possible to securely prevent dry-out of a heat receiving portion 41 while avoiding the forbidden region 101 and to improve heat radiation performance of the heat radiating fin group 20 thermally connected to the heat radiating portion 42 of the heat transport member 10.

Next, a heatsink according to a third embodiment of the present disclosure will be described with reference to the drawings. Note that since the heatsink according to the third embodiment has a main portion in common with those of heatsinks according to the first and second embodiments, the same reference sign is used to describe the same component. Note that FIG. 8 is a perspective view for describing an outline of an inside of the heatsink according to the third embodiment of the present disclosure.

Figure 8:
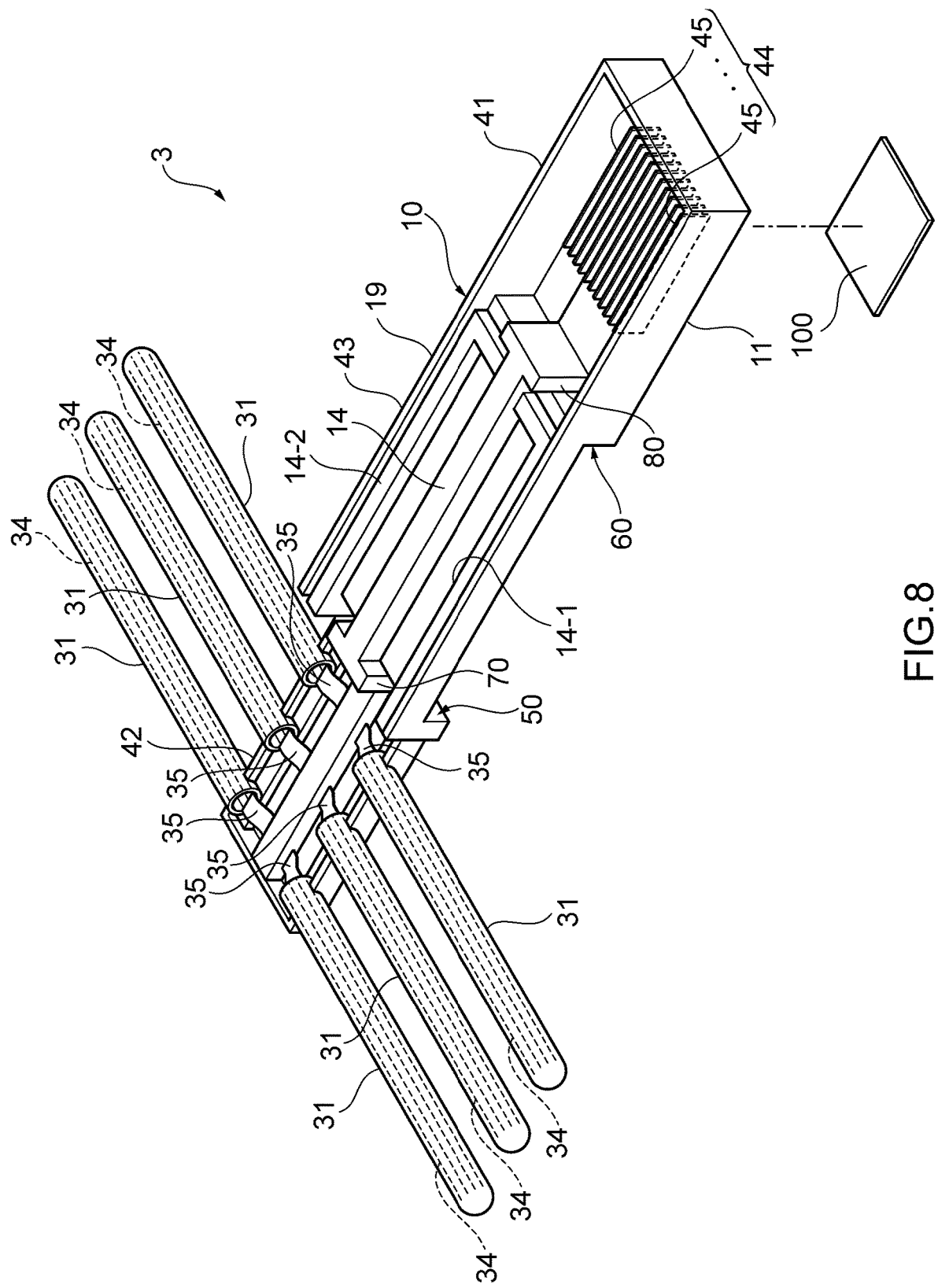
FIG. 8 A perspective view for describing an outline of an inside of a heatsink according to a third embodiment of the present disclosure.

As illustrated in FIG. 8, in a heatsink 3 according to the third embodiment, a wick structure 14 extended from a heat receiving portion 41 to a heat radiating portion 42 of a container 19 in a central portion in a width direction of a heat transport member 10 branches between the heat receiving portion 41 and the heat radiating portion 42. In the heatsink 3, the wick structure 14 has branch portions in a part near a side of a heat radiating portion 42 of a second step portion 80, and two branch wick portions 14-1 and 14-2 are respectively extended in a longitudinal direction of the wick structure 14 on both sides in a width direction of the container 19 of the heat transport member 10. The wick structure 14 is extended from the heat receiving portion 41 to the heat radiating portion 42, and each of the branch wick portions 14-1 and 14-2 is extended substantially in parallel at a predetermined interval with respect to the wick structure 14 from the part near the side of the heat radiating portion 42 of the second step portion 80 to the heat radiating portion 42. Thus, each of the branch wick portions 14-1 and 14-2 has a step portion corresponding to a step of a heat radiating-side step portion 50 as in the case of the wick structure 14.

A different wick structure 34 provided in the pipe body 31 is connected to the wick structure 14, and the branch wick portion 14-1 or the branch wick 14-2 via a connection member 35. Thus, a liquid-phase working fluid inside the pipe body 31 flows back from the different wick structure 34 to the wick structure 14 and the branch wick portion 14-1 or 14-2 via the connection member 35.

In the heatsink 3, the wick structure 14 not only has a first step portion 70 corresponding to the step of the heat radiating-side step portion 50 but also has the branch wick portions 14-1 and 14-2 respectively having step portions corresponding to the step of the heat radiating-side step portion 50. Thus, the liquid-phase working fluid can flow back more smoothly from the pipe body 31 and the heat radiating portion 42 to the heat receiving portion 41. Thus, in the heatsink 3, even when installation is in a top heat position in which the heat receiving portion 41 is placed on an upper side of the heat radiating portion 42 in a direction of gravity, the liquid-phase working fluid can flow back more securely from the pipe body 31 and the heat radiating portion 42 to the heat receiving portion 41, and dry-out of the heat receiving portion 41 can be more securely prevented.

Figure 9:
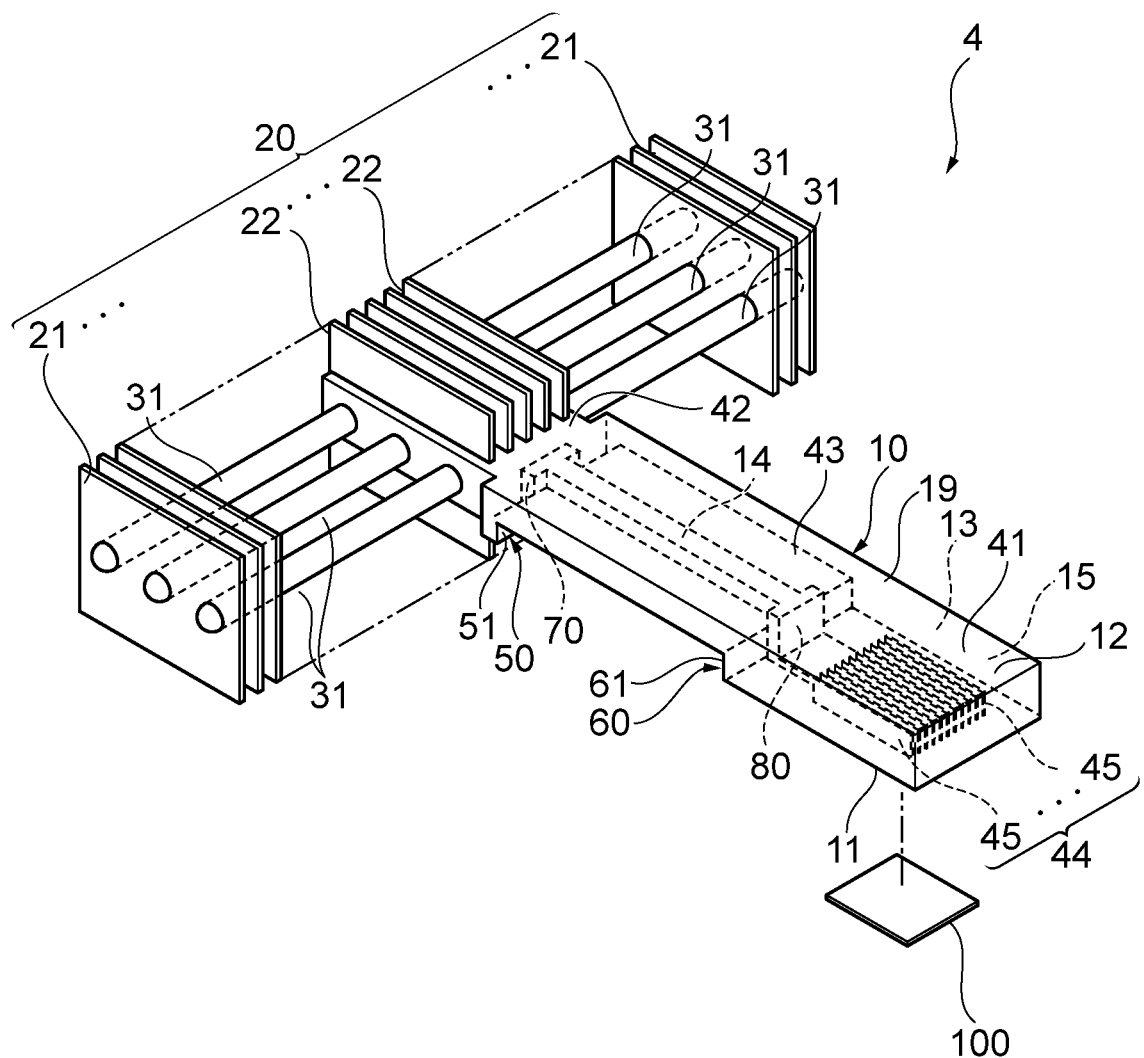
FIG. 9 A perspective view for describing an outline of a heatsink according to a fourth embodiment of the present disclosure.

Next, a heatsink according to a fourth embodiment of the present disclosure will be described with reference to the drawings. Note that since the heatsink according to the fourth embodiment has a common main portion with the heatsinks according to the first to third embodiments, the same reference sign is used to describe the same component. Note that FIG. 9 is a perspective view for describing an outline of the heatsink according to the fourth embodiment of the present disclosure.

In the heatsink according to the first embodiment, a heat radiating-side step portion includes a step portion that is a step in a direction substantially orthogonal to a heat transport direction of a heat transport member which step is provided in one plate-like body, and a step portion that is a step in a direction substantially orthogonal to the heat transport direction of the heat transport member which step is provided in the other plate-like body. Alternatively, as illustrated in FIG. 9, in a heat radiating-side step portion 50 in a heatsink 4 according to the fourth embodiment, a step portion 51 that is a step in a direction substantially orthogonal to a heat transport direction of a heat transport member 10 which step is provided in one plate-like body 11 is provided but a step portion in a direction substantially orthogonal to the heat transport direction of the heat transport member 10 is not provided in the other plate-like body 12. Thus, a heat insulating portion 43 and a heat radiating portion 42 are not placed on the same plane in the one plate-like body 11. On the other hand, the heat insulating portion 43 and the heat radiating portion 42 are placed on the same plane in the other plate-like body 12. From the above, a thickness of a container 19 in the heat radiating portion 42 is larger than a thickness of the container 19 in the heat insulating portion 43 for a size of the heat radiating-side step portion 50. Thus, a thickness of the heat radiating portion 42 of the heatsink 4 according to the fourth embodiment is larger than a thickness of the heat radiating portion of the heatsink according to the first embodiment described above. Also, an internal space of the container 19 in the heat radiating-side step portion 50 of the heatsink 4 according to the fourth embodiment is wider than an internal space of the container in the heat radiating-side step portion of the heatsink according to the first embodiment described above.

A wick structure 14 is also extended from a heat receiving portion 41 to the heat radiating portion 42 of the heat transport member 10 in the heatsink 4. Also, the wick structure 14 has a first step portion 70 following the step of the heat radiating-side step portion 50 and a second step portion 80 following a step of a heat receiving-side step portion 60.

In the heatsink 4, since the internal space of the container 19 in the heat radiating-side step portion 50 is wide, a liquid-phase working fluid can smoothly flow back in a direction of the heat receiving portion 41 from the heat radiating portion 42 in the first step portion 70 even when the heat radiating-side step portion 50 is provided between the heat insulating portion 43 and the heat radiating portion 42 of the heat transport member 10.

Next, a different embodiment of a heatsink of the present disclosure will be described in the following. In a heatsink of each of the above embodiments, a pipe body 31 an internal space of which communicates with a cavity 13 of a container 19 is connected to a heat transport member 10, and first heat radiating fins 21 of a heat radiating fin group 20 are thermally connected to the pipe body 31. However, no pipe body 31 may be connected to a heat transport member 10, and no first heat radiating fin 21 may be provided in a heat radiating fin group 20. Also, when necessary, a first step portion 70 of a wick structure 14 may have a wide portion 73 that is more widened in a direction orthogonal to a heat transport direction of a heat transport member 10 (width direction of heat transport member 10) than the wick structure 14 in positions of a heat insulating portion 43 and a heat radiating portion 42 (see FIGS. 1 and 3). That is, a width of the first step portion 70 may be larger than a width of the wick structure 14 placed in the heat insulating portion 43 and the heat radiating portion 42. Since the width of the first step portion 70 is widened, a liquid-phase working fluid can more smoothly flow back from the heat radiating portion 42 to the heat insulating portion 43. Also, when necessary, a second step portion 80 of the wick structure 14 may have a wide portion 83 that is more widened in the width direction of the heat transport member 10 than the wick structure 14 in positions of the heat insulating portion 43 and a heat receiving portion 41 (see FIGS. 1 and 3). Since the width of the second step portion 80 is widened, the liquid-phase working fluid can more smoothly flow back from the heat insulating portion 43 to the heat receiving portion 41.

In a heatsink according to each of the above-described embodiments, a heat receiving-side step portion 60 is formed in a heat transport member 10. However, no heat receiving-side step portion 60 may be provided depending on a use condition or an installation condition of a heatsink.

Since having good cooling performance in an environment with a limited installation space for a heatsink even when a forbidden region exists in the installation space, a heatsink of the present disclosure is highly useful in a field of cooling an electronic component that is mounted on a circuit board installed in a narrow space and that generates a large amount of heat, the component being an electronic component such as a central processing unit, for example.

What is claimed is:

1. A heatsink comprising:
a heat transport member having a heat receiving portion thermally connected to an electronic component; a pipe body connected to a heat radiating portion of the heat transport member; and a heat radiating fin group which is thermally connected to the pipe body and in which a plurality of heat radiating fins is arranged, wherein
the heat transport member has an integral internal space that communicates from the heat receiving portion to a connection portion with the pipe body and that is filled with a working fluid, the internal space of the heat transport member communicating with an internal space of the pipe body,
a wick structure extended from the heat receiving portion to the heat radiating portion is housed in the internal space of the heat transport member,
the heat transport member has a heat radiating-side step portion, in which a step is provided in a direction that is not a direction parallel to a heat transport direction of the heat transport member, between a heat insulating portion placed between the heat receiving portion and the heat radiating portion and the heat radiating portion, the heat insulating portion and the heat radiating portion are not placed on a same plane,
a different wick structure is provided on an inner surface of the pipe body, the wick structure and the different wick structure being connected via a connection member, and
the connection member is a wick member having capillary force, a kind of the wick structure provided in the heat transport member, a kind of the different wick structure provided in the pipe body, and a kind of the wick member are different.

2. The heatsink according to claim 1, wherein the wick structure has a first step portion that follows the step of the heat radiating-side step portion.

3. The heatsink according to claim 1, wherein the heat transport member further has, between the heat receiving portion and the heat insulating portion, a heat receiving-side step portion in which a step is provided in a direction that is not the direction parallel to the heat transport direction of the heat transport member.

4. The heatsink according to claim 3, wherein the wick structure further has a second step portion that follows the step of the heat receiving-side step portion.

5. The heatsink according to claim 2, wherein the wick structure in the first step portion is more widened in a direction orthogonal to the heat transport direction of the heat transport member than the wick structure in positions of the heat insulating portion and the heat radiating portion.

6. The heatsink according to claim 1, wherein the pipe body is extended in an arrangement direction of the heat radiating fins.

7. The heatsink according to claim 1, wherein an extension direction of the pipe body is not parallel to the heat transport direction of the heat transport member.

8. The heatsink according to claim 1, wherein a plurality of the pipe bodies is provided and is extended in a plurality of directions from the heat transport member.

9. The heatsink according to claim 1, wherein at least one surface of the heat transport member has a planar shape.

10. The heatsink according to claim 1, wherein the different wick structure provided in the pipe body is a plurality of narrow grooves formed in the inner surface of the pipe body.

* * * * *